US012723326B2

(12) United States Patent
Zhao et al.

(10) Patent No.: US 12,723,326 B2
(45) Date of Patent: Sep. 1, 2026

(54) METHODS FOR AUTOMATICALLY CONTROLLING MATERIAL SUCTION IN A PROCESS OF PULLING-UP OF A MONOCRYSTAL

(71) Applicant: TCL ZHONGHUAN RENEWABLE ENERGY TECHNOLOGY CO., LTD., Tianjin (CN)

(72) Inventors: Zilong Zhao, Hohhot (CN); Jianping Wang, Hohhot (CN); Long Xiang, Hohhot (CN); Zhenyu Liu, Hohhot (CN); Jian Xu, Hohhot (CN); Lin Wang, Hohhot (CN)

(73) Assignee: TCL ZHONGHUAN RENEWABLE ENERGY TECHNOLOGY CO., LTD., Tianjin (CN)

( * ) Notice: Subject to any disclaimer, the term of this patent is extended or adjusted under 35 U.S.C. 154(b) by 713 days.

(21) Appl. No.: 18/161,898

(22) Filed: Jan. 31, 2023

(65) Prior Publication Data

US 2023/0167578 A1 Jun. 1, 2023

Related U.S. Application Data

(63) Continuation-in-part of application No. PCT/CN2022/114685, filed on Aug. 25, 2022.

(30) Foreign Application Priority Data

Aug. 25, 2021 (CN) ......................... 202110983854.6

(51) Int. Cl.

| | |
|---|---|
| ***C30B 15/20*** | (2006.01) |
| ***C30B 15/22*** | (2006.01) |
| ***C30B 29/06*** | (2006.01) |

(52) U.S. Cl.
CPC .............. *C30B 15/22* (2013.01); *C30B 29/06* (2013.01)

(58) Field of Classification Search
CPC ......... C30B 15/00; C30B 15/14; C30B 15/20; C30B 15/22; C30B 15/28; C30B 29/00;
(Continued)

(56) References Cited

U.S. PATENT DOCUMENTS 5,272,119 A * 12/1993 Falster ................ H01L 21/3221 148/DIG. 24
5,288,366 A * 2/1994 Holder .................... C30B 15/02 117/214

(Continued)

FOREIGN PATENT DOCUMENTS

CN 109844966 A 6/2019
CN 111020700 A * 4/2020 ............ C30B 15/02

(Continued)

OTHER PUBLICATIONS

International Search Report in International application No. PCT/CN2022/114685, mailed on Aug. 25, 2022.

(Continued)

*Primary Examiner* — Kenneth A Bratland, Jr.
(74) *Attorney, Agent, or Firm* — PV IP PC; Christopher S. Ruprecht; Wei Te Chung

(57) ABSTRACT

The present disclosure provides a method for automatically controlling material suction in a process of pulling-up of a monocrystal, including the steps of: obtaining a lifetime value and a resistivity of a pulled monocrystalline silicon rod; determining the lifetime value and a ratio of the lifetime value to the resistivity of the pulled monocrystalline silicon rod; if both the lifetime value and the ratio of the lifetime value to the resistivity are greater than set values, continuing to perform a re-feeding and pulling procedure; and if the
(Continued)

lifetime value or/and the ratio of the lifetime value to the resistivity is less than or equal to the set values, performing a segment-taking and material suction procedure.

18 Claims, 3 Drawing Sheets

(58) Field of Classification Search
CPC ......... C30B 29/02; C30B 29/06; C30B 33/00; C30B 33/02
USPC ........ 117/11, 13–15, 35, 200–202, 206, 208, 117/214, 928, 931–932
See application file for complete search history.

(56) References Cited

U.S. PATENT DOCUMENTS

2007/0227439 A1* 10/2007 Yokoyama .............. C30B 15/20 117/14
2019/0247889 A1 8/2019 Letty et al.

FOREIGN PATENT DOCUMENTS

JP 2009249234 A 10/2009
JP 2009280471 A 12/2019

OTHER PUBLICATIONS

Written Opinion of the International Search Authority in International application No. PCT/CN2022/114685, mailed on Aug. 25, 2022.

* cited by examiner

METHODS FOR AUTOMATICALLY CONTROLLING MATERIAL SUCTION IN A PROCESS OF PULLING-UP OF A MONOCRYSTAL

CROSS-REFERENCE TO RELATED APPLICATIONS

This application is a continuation of International Application No. PCT/CN2022/114685, filed on Aug. 25, 2022, which claims priority to and the benefit of Chinese Patent Application No. 202110983854.6, filed on Aug. 25, 2021. The disclosures of the aforementioned applications are incorporated herein by reference in their entireties.

TECHNICAL FIELD

The present disclosure relates to a technical field of pulling a solar photovoltaic monocrystal, and in particular to methods for automatically controlling material suction in a process of pulling-up of a monocrystal.

BACKGROUND

In some circumstances, in order to reduce the cost and increase the efficiency, a monocrystal may be pulled by segment-taking and re-feeding. The repeated segment-taking and re-feeding may result in accumulation of impurities such as metal and the like in the residual material in the crucible, which may greatly reduce lifetime of the minority carrier of the next monocrystal and thus affect the quality of the monocrystal and the effective yield. Moreover, once the lifetime of the minority carrier becomes abnormal, the furnace must be stopped directly, thereby increasing the cost of opening the furnace and reducing the profit. The production of the defect rate of the monocrystalline silicon rods can be timely terminated by sucking out the material at the bottom of the crucible. However, in general, the material suction is performed manually, which has not only low efficiency and long suction time but also poor material suction effect due to different personnel proficiency. Generally, it will take 3-4 hours for two people to perform manual material suction, which significantly affects the production schedule and production efficiency.

SUMMARY

In view of the above, one aspect of the present disclosure provides a method for automatically controlling material suction in the process of pulling-up of a monocrystal, the method including:

obtaining a lifetime value and a resistivity of a pulled monocrystalline silicon rod, and continuing to operate a monocrystalline silicon rod being pulled;

performing one of:

in response to determining that the lifetime value is greater than a preset lifetime value and the ratio of the lifetime value to the resistivity is greater than a preset ratio value, continuing to perform a re-feeding and pulling procedure; and in response to determining that the lifetime value is less than or equal to the preset lifetime value or/and the ratio of the lifetime value to the resistivity is less than or equal to the preset ratio value, performing a segment-taking and material suction procedure.

Another aspect of the present disclosure provides a method for automatically controlling material suction in the process of pulling-up of a monocrystal, and the method includes: obtaining a lifetime value and a resistivity of a pulled monocrystalline silicon rod; and in response to determining that the pulled monocrystalline silicon rod is unqualified based on the lifetime value and a ratio of the lifetime value to the resistivity, performing a segment-taking and material suction procedure.

DETAILED DESCRIPTION

The present disclosure is described in detail below with reference to the accompanying drawings and specific embodiments.

It should be noted that, in the embodiments of the present disclosure, the term "segment-taking" refers to a procedure of taking out (or removing) the monocrystalline silicon rod being pulled or finished from the pulling equipment of the monocrystalline silicon rod, the term "re-feeding" refers to a procedure of putting the raw materials used to form the monocrystalline silicon rod into the pulling equipment again during the operation of the pulling equipment of the monocrystalline silicon rod, and the term "material suction" refers to the procedure for removing the leftovers from the crucible.

Figure 1:
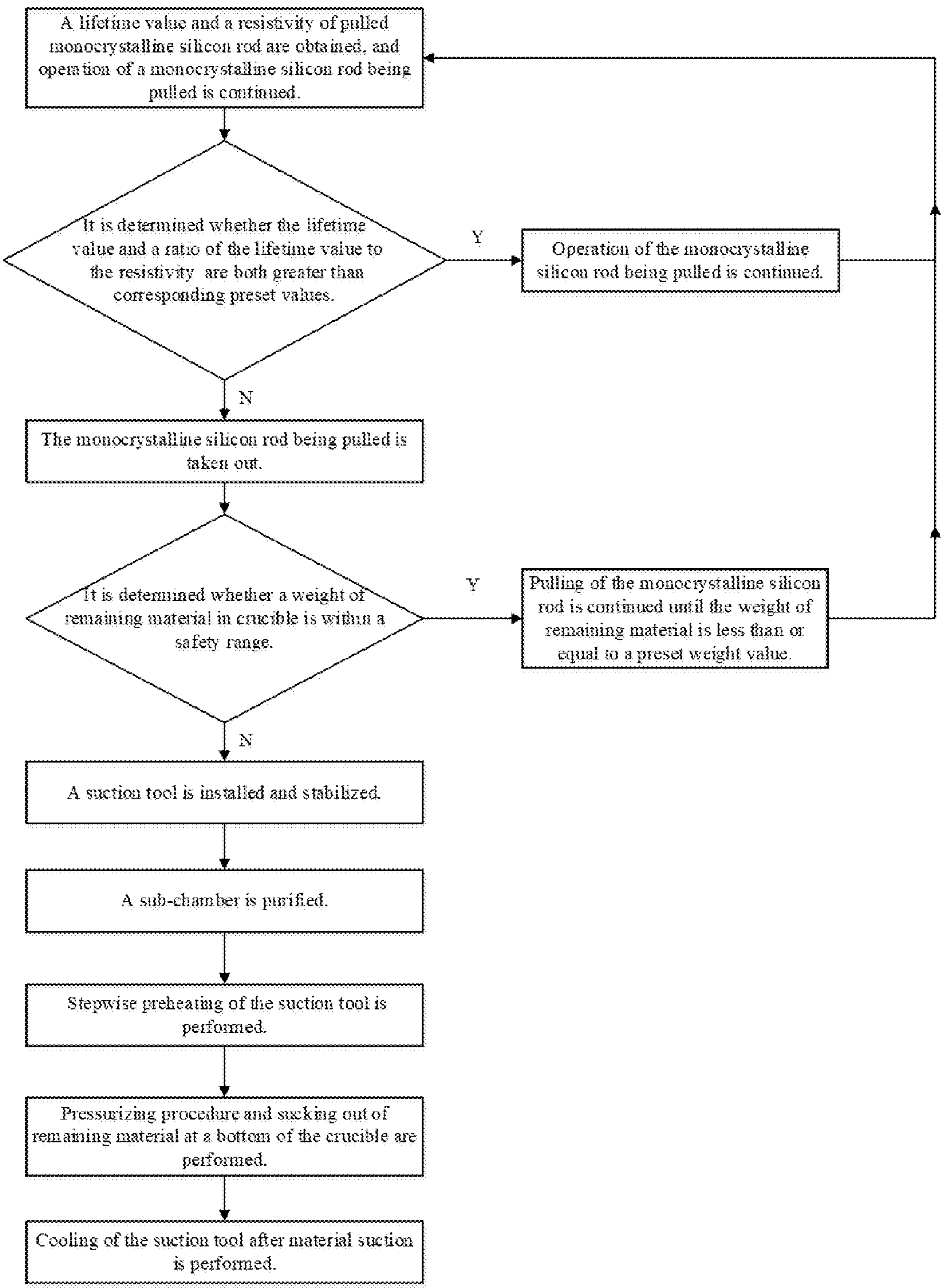
FIG. 1 is a flow chart of a method for automatically controlling material suction in the process of pulling-up of a monocrystal according to an embodiment of the present disclosure.

As shown in FIG. 1, a method for automatically controlling material suction in a process of pulling-up of a monocrystal according to an embodiment of the present disclosure may include the following steps.

Initially, it may be determined whether the requirement of performing a segment-taking and material suction procedure is met.

At step S11, a lifetime value and a resistivity of a pulled monocrystalline silicon rod may be obtained, and operation of the monocrystalline silicon rod being pulled may be continued.

Each monocrystalline silicon rod that is pulled and finished, needs to be tested for its minority carrier lifetime value and resistivity. Generally, the minority carrier lifetime value and resistivity value at the head part of the silicon rod are the maximum values in the whole monocrystal. Therefore, when selecting and judging, the lifetime value and the resistivity of the monocrystalline silicon rod close to the end face of the head part are both are selected as the lifetime value and the resistivity of the monocrystalline silicon rod, and the lifetime value and the resistivity are both test values at the same position.

In the prior art, the value of the lifetime value or/and the resistivity is taken into account, that is, only the lifetime value is used as the sole judgment criterion, or only the resistivity is used as the sole judgment criterion, or both the lifetime value and the resistivity are used as the judgment criterion. In the case of considering only the lifetime value, if the lifetime value is low due to the low resistivity, rather than low due to metal impurities, the parameter is mistaken for a problem, thereby degrading the product and causing loss. In the case of considering only the resistivity as the only judgment condition, the lifetime value is substantially proportional to the resistivity, but the lifetime value is reduced due to the metal impurities, and the resistivity does not change due to the stability of the dopant, that is, the resistivity is qualified. In this case, if the wafer rod is considered to be qualified in quality only by judging the resistivity is qualified, this may result in misjudgment of the quality of the wafer rod, resulting in waste products entering the good products, and affecting the yield. However, in the above two cases, when both the life value and the resistivity are judged, the wafer rod in both conditions is not qualified, which will cause greater losses.

Therefore, the life value and the ratio of the life value to the resistivity are selected and used for judgment, so that not only the probability of the product degradation due to misjudgment is prevented, but also the possibility of judging the waste as a good product is avoided. Moreover, the consistency of the product parameters of the wafer rod and the actual product quality may be accurately judged. However, for selecting the lifetime value and the ratio of the lifetime value to the resistivity close to the end face of the head part, the reason is that the lifetime value and the resistivity of the head part are the optimal technical parameters of the whole monocrystal. Once the technical parameters of the position of the head part do not meet the requirements, the lifetime value and the resistivity of the whole monocrystalline silicon rod are certainly not qualified, that is, the technical parameters of the head part are the criteria for judging the whole monocrystal. At the time of testing, the lifetime value is a test value at the center position of the end face of the head part of the silicon rod; and the resistivity is an average of the multipoint test values.

At step S12, it may be determined whether the lifetime value and the ratio of the lifetime value to the resistivity of the pulled monocrystalline silicon rod are qualified.

After obtaining the lifetime value and the resistivity of the monocrystalline silicon rod that are measured, manually entering the data into the program, the system automatically stores and identifies the preferred and more concentrated lifetime values of all silicon rods of this size.

The system calculates the lifetime value and the ratio of the lifetime value to resistivity of the monocrystalline silicon rod, and judges the lifetime value and the ratio of the lifetime value to resistivity of the monocrystalline silicon rod that has been pulled.

If the lifetime value and the ratio of the lifetime value to the resistivity are both greater than corresponding set values, continuing to perform a re-feeding and pulling procedure;

If the lifetime value or/and the ratio of the lifetime value to the resistivity are not greater than the corresponding set values, that is, for the lifetime value and the ratio of the lifetime value to the resistivity, as long as there is one item that is not greater than the corresponding set value, the segment-taking and material suction procedure is performed.

The set value of the lifetime value is 120-125 us; the set value of the ratio of the lifetime value to the resistivity is 150-250. It will be appreciated by those skilled in the art that the above set values may be varied and adjusted according to the process conditions and requirements of a particular process of pulling-up of a monocrystal, and are not limited to being within this range.

If any result is larger than the set value, it indicates that the quality of the monocrystalline silicon rod is qualified, and then the re-feeding and pulling procedure is continued, that is, the monocrystalline silicon rod being pulled is continued, and after the pulling is completed, the re-feeding is performed.

Each time a monocrystalline silicon rod is pulled, the lifetime value or the ratio of the lifetime value to the resistivity thereof should be judged, until the result is less than the set value, the "segment-taking and material suction procedure" is performed.

Then, a segment-taking and material suction procedure may be performed.

At step S21, the monocrystalline silicon rod being pulled may be taken out.

When the last monocrystalline silicon rod being pulled is removed from the liquid surface of the molten silicon, the crucible position of the quartz crucible is controlled to drop to a set material suction position. In the present embodiment, the position of the quartz crucible drops to a height of 280 mm from the quartz crucible zero position, wherein the zero position of the quartz crucible is the position where the upper edge of the quartz crucible aligns with the upper edge of the main heater.

Meanwhile, the power of the main heater and the power of the bottom heater are increased so that the power of the main heater is 10-15 kw higher than that of the main heater at the time of seeding, and the power of the bottom heater is 15-20 kw higher than that of the bottom heater at the time of seeding. At this time, the power values of the main heater and the bottom heater are constant until the end of the material suction.

When the rotation speed of the quartz crucible is reduced to 1-2 r/min, a cooling process is automatically performed on the monocrystalline silicon rod being pulled, that is, during the lifting of the monocrystalline silicon rod, the monocrystalline silicon rod is slowly lifted to leave the main chamber to the sub-chamber, and is allowed to stand and cool several times in the main chamber and the sub-chamber for several minutes to complete the cooling of the monocrystalline silicon rod.

When the monocrystalline silicon rod enters the sub-chamber, that is, the isolating valve of the sub-chamber is closed, the sub-chamber is controlled to be opened, and the monocrystalline silicon rod is placed in a crystal taking barrel to be cooled.

At step S22, it may be determined whether a weight of remaining material in the quartz crucible is within a safety range.

When performing the segment-taking and material suction procedure, it is necessary to determine in advance whether the remaining material in the quartz crucible is greater than 25 kg. If so, that is, the remaining material in the quartz crucible is greater than 25 kg, the pulling of the monocrystalline silicon rod is continued until the remaining material is less than or equal to 25 kg.

If not, the pulling of the monocrystalline silicon rod is stopped and the next material suction process is started.

In an embodiment of the present disclosure, the safety range may represent a case where the weight of the remaining material in the quartz crucible is greater than a predetermined weight (e.g., 25 kg). However, the embodiments of the present disclosure are not limited thereto, and the term "safety range" is intended for purposes of description only and is not intended to limit the present disclosure. In other embodiments, the safety range may indicate that the weight of the remaining material in the quartz crucible is less than or equal to the predetermined weight (e.g., 25 kg). In this case, if the remaining material in the quartz crucible is within the safety range, the material suction process is performed, and if not, the pulling process is continued until the remaining material is within the safety range.

Next, a material suction process may be performed.

At step S231: a suction tool may be installed and stabilized.

A seed crystal chuck tool installed on a heavy hammer is manually disassembled, and a suction tool is manually installed.

After the suction tool is installed, the sub-chamber is closed.

It is determined and identified that the suction tool is successfully installed. In particular, the suction tool is quickly automatically raised to a minimum height position (or a lowest position in the sub-chamber that does not affect the isolating valve) that can be identified by a remote infrared sensor installed on the isolating valve in the sub-chamber connected to the main chamber, for example, the minimum identification position is 2000-2400 mm higher than the seed crystal zero position. Wherein the seed crystal zero position is a position where the lower edge surface of the graphite chuck (see 340 in FIG. 2) of the seed crystal is aligned with the lower edge surface of the flow guide cylinder (see 160 in FIGS. 2 and 3).

When the suction tool is successfully installed, the suction tool is automatically controlled to fall to 1600-1800 mm above the seed crystal zero position.

Then, through the CCD observation window provided on the outer side wall of the main chamber, it is determined whether the suction tool is shaking, as follows:

- if it is monitored that the suction tool is still shaking within the set time, the system automatically gives an alarm indicating that the suction tool is not stable, and the operator is prompted to switch to manually control the suction tool stability control;
- if not, it indicates that the suction tool has been stably hoisted, and the system automatically executes the next sub-chamber purification procedure.

At step S232, the sub-chamber may be purified.

The suction tool is controlled to be lifted again to the minimum identification position that is 2000-2400 mm higher than the seed crystal zero position, at which time the isolating valve of the sub-chamber is still closed.

The sub-chamber is purified and isolated, that is, the suction tool is still suspended and isolated at the minimum identification position in the sub-chamber, and the air in the sub-chamber is purified. Both the purification time and the air pressure are preset procedures and are automatically executed.

After the purification of the sub-chamber is completed, the isolating valve of the sub-chamber is opened to control the suction tool to enter the main chamber.

At step S233, a stepwise preheating of the suction tool may be performed.

The suction tool is preset to be preheated by standing at least twice, and as the depth of descent of the suction tool is increased, the time for each time of standing preheating is prolonged by 4-10 min from the previous time.

Specifically, the system automatically controls the suction tool to be first lowered to a position at a height of 500-600 mm from the seed crystal zero position. For example, the first preheating position is provided on a side of the inner side of the water cooling jacket (see 150 in FIGS. 2 and 3) close to the lower end face, and the lower end face of the suction tool is also inside the water cooling jacket. The first preheating time is 1-2 min. Since the suction tool directly enters the main chamber at a high temperature from the sub-chamber at a room temperature, a stepwise heating may avoid bursting of the suction tool due to heating.

Then, the suction tool continues to descend to a position of 300-350 mm height from the seed crystal zero position, and for example, the second preheating position is below the flow guide cylinder, where the heating time is 5-9 min.

After the second preheating is completed, the system controls the suction tool to descend until it comes into contact with the liquid surface of the molten silicon. The standard for the system to judge the contact between the suction tool and the liquid surface is whether it receives a contact voltage alarm of the suction tool. Since the molybdenum of the heavy hammer and the material of the suction tool are all conductor materials, and the molten silicon is also a conductor material, when the three are connected, an electric conductor is formed. The standard for the contact voltage is set to 0-10 V, once the contact voltage exceeds this range, the system will beep alarm sound. When the suction tool and the liquid surface of the molten silicon are in contact with each other, the contact voltage value is negative, and an alarm sound will appear. When the system receives the contact voltage alarm of the suction tool, the system automatically adjusts the height of the suction tool upward from the liquid surface to be raised by 1-5 mm, the suction tool is statically preheated for a third time, and the preheating time is 5-9 min. The overall temperature of the suction tool after stepwise heating is matched with the temperature of the liquid surface of the molten silicon, which ensures that the molten silicon will not be quickly cooled and solidified due to the low temperature of the suction tool after entering the suction tool, which is not conducive to the flow collection of all melts. Meanwhile, the phenomenon of silicon leakage caused by cracks due to uneven heating and thermal expansion and contraction of the suction tool is also avoided. It will be appreciated by those skilled in the art that the height of the suction tool from the liquid surface and the preheating time may be varied and adjusted based on the particular process conditions and requirements when standing preheating, and are not necessarily within this range.

After the third stepwise heating is finished, the system controls the suction tool to drop to the liquid surface again, and judges whether the suction tool is in contact with the liquid surface.

Once the suction tool is in contact with the liquid surface, the alarm is generated for the contact voltage. When the alarm is received for the contact voltage of the suction tool, the system automatically adjusts the rotation speed of the quartz crucible to lr/min, indicating that the stepwise preheating of the suction tool (step S233) is completed.

It should be appreciated by those skilled in the art that when the contact voltage alarm of the suction tool is received, the system automatically adjusts the rotational speed of the quartz crucible to vary and adjust it based on the particular process conditions and requirements, and is not limited to this value.

At step S234, pressurizing procedure and sucking out of the remaining material at the bottom of the crucible using the preheated suction tool may be performed.

When the contact voltage alarm of the suction tool is received, the suction tool is controlled to drop to 20-45 mm below the contact liquid surface, that is, the suction tool drops to within 20-45 mm from the liquid surface, so that the suction head of the suction tool is completely immersed in the melt, thereby ensuring the sealability and safety of the inner cavity of the suction tool.

After the lowering and immersion of the suction tool is completed, the system automatically controls the quartz crucible to directly stop rotating from the original 1 r/min, and the suction tool is stationary.

The system is set to automatically exit a pressure control procedure and quickly pressurizes the sub-chamber to a standard suction pressure value. That is, when the pressure control procedure is exited, the system controls the opening of the throttle valve that is pressurized to the main chamber to 0%, automatically opens the quick-pressurizing valve, and closes the ball valve. When the pressure in the furnace body of the main chamber is rapidly increased to 190-200 torr, the pressure at the outer wall of the suction tool is made larger than the pressure in the inner cavity of the suction tool, and the pressure difference occurs in the suction tool, so that the melt may be forced to be sucked into the inner cavity of the suction tool.

After the material suction was completed, the ball head valve is automatically opened, and the opening of the throttle valve is opened to 15%.

When the gravity sensor for monitoring the suction tool monitors that the weight of the suction tool after the material suction is larger than the weight before the material suction, and the suction tool is stationary, it indicates that the material suction is completed.

At step S235, cooling of the suction tool after the material suction may be performed.

The quartz crucible is started to rotate at a low speed and held at 1 r/min. Meanwhile, the suction tool is controlled to automatically slowly ascend upward, and stand and cool down for a period of time.

Specifically, when the suction tool loaded with the remaining material is raised into the water cooling jacket, that is, when the height of the suction tool from the seed crystal zero position is 300-350 mm, the suction tool is allowed to stand and cool for 15-20 min so that the molten material is gradually solidified in the suction tool in the main chamber.

By opening the isolating valve of the sub-chamber, the suction tool loaded with the residual material is raised to the lowest point of the identification position in the sub-chamber, that is, when the suction tool is located at a height of 2000-2400 mm from the seed crystal zero position, the suction tool is allowed to stand and cool for 20-25 min. The temperature in the sub-chamber is lower than that in the main chamber, and it is conducive to the heat dissipation of the suction tool. Since the molten material entering the inner cavity of the suction tool still has a certain residual temperature, it is necessary to further extend the cooling time thereof, and the cooling time is longer than that in the water cooling jacket, so that the molten silicon material is completely solidified in the inner cavity of the suction tool.

After the second cooling of the suction tool is completed, the quick-pressurizing valve is automatically closed, and the pressure control procedure is started to ensure that the pressure in the main chamber is within a suitable control range.

The sub-chamber is opened, and the cooled suction tool loaded with the remaining materials is taken out.

At this time, the automatic material suction process is completed.

The cooled suction tool is manually taken out. The sub-chamber is reset to prepare for the next step of the re-feeding.

The method for automatically controlling material suction of the present disclosure is further illustrated by pulling a monocrystalline silicon rod having a diameter of 300 mm as a preferred embodiment.

Figure 2:
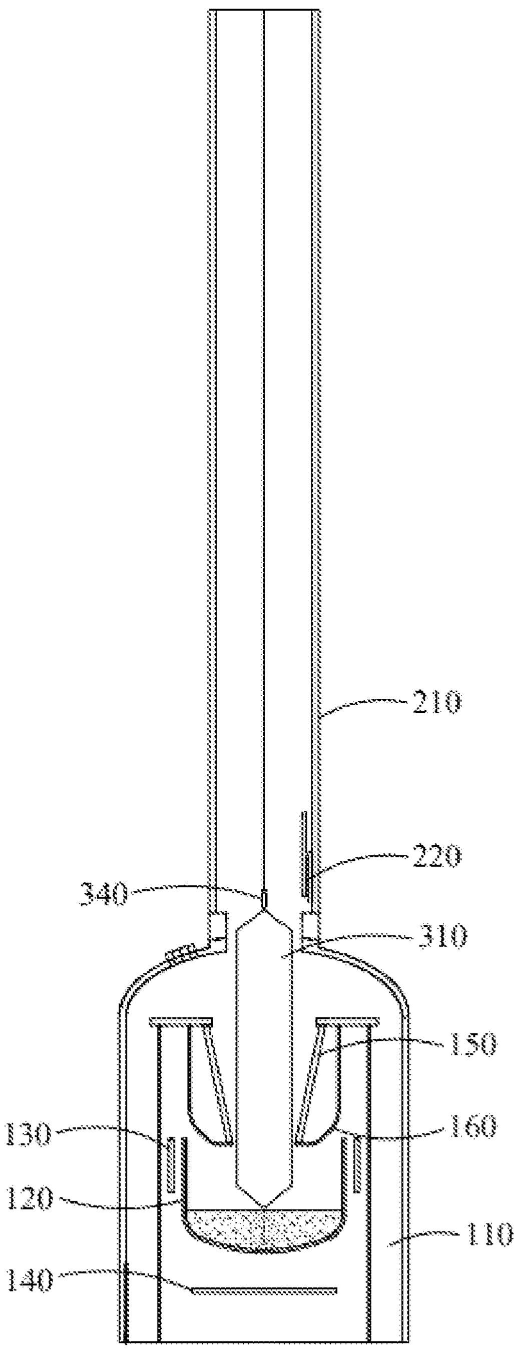
FIG. 2 is a schematic diagram illustrating an apparatus for performing a process of pulling the monocrystalline silicon rod according to an embodiment of the present disclosure.
Figure 3:
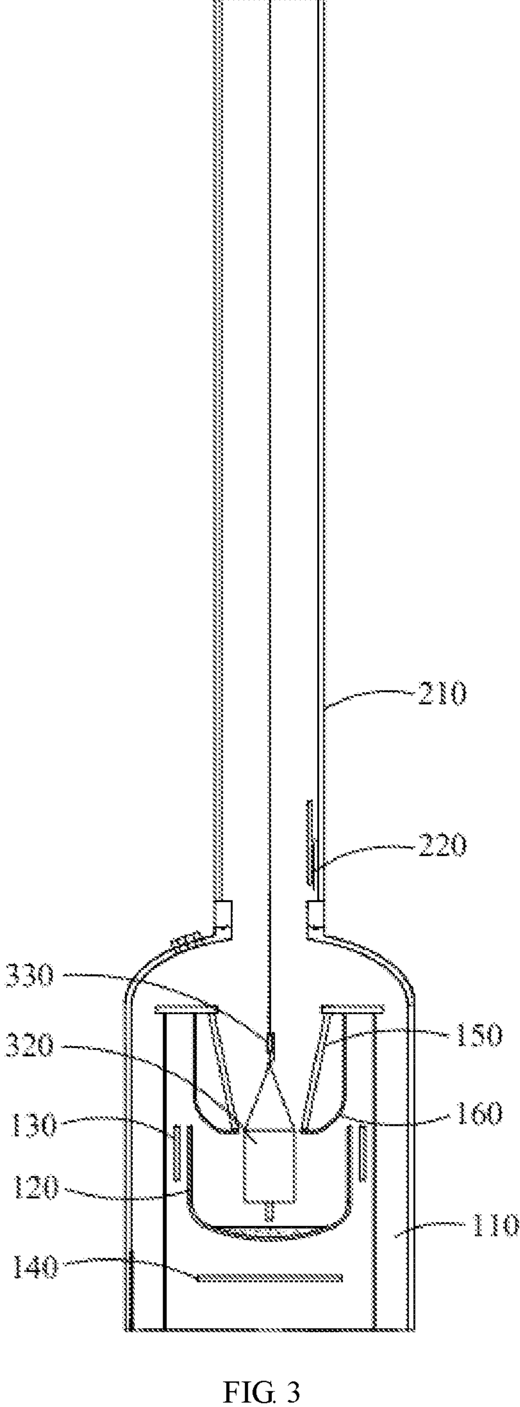
FIG. 3 is a schematic diagram illustrating an apparatus for performing a material suction process according to an embodiment of the present disclosure.

The above method will be described in detail with reference to FIGS. 1 to 3, in which FIG. 2 is a schematic diagram illustrating an apparatus for performing the process of pulling the monocrystalline silicon rod according to an embodiment of the present disclosure, and FIG. 3 is a schematic diagram illustrating an apparatus for performing the material suction process according to an embodiment of the present disclosure.

EXAMPLE 1

Initially, it may be determined whether it meets the requirement of the segment-taking and material suction procedure.

At step S11, the lifetime value and the resistivity of a first monocrystalline silicon rod that has been pulled may be obtained, and operation of the monocrystalline silicon rod being pulled may be continued.

The lifetime value and the resistivity at the end surface of the head part of the first monocrystalline silicon rod are measured to be 138 μs and 0.3 Ω·m, respectively.

At step S12, it may be determined whether the lifetime value and the ratio of the lifetime value to the resistivity of the first monocrystalline silicon rod are qualified.

It can be seen from the step S11 that the lifetime value 138 μs is greater than the set value 120-125 μs (for example, the set value 120 μs is used as an example for description in this embodiment); the ratio of the lifetime value to the resistivity is 460, which is greater than the set value 150-250 (for example, the set value of 250 is used as an example in the present embodiment).

Then, it indicates that the lifetime value and the ratio of the lifetime value to the resistivity of the first monocrystal are both qualified to meet the parameter requirements of the crystal, the operation of the monocrystalline silicon rod being pulled is continued, and the re-feeding and pulling procedure is continued.

Repeating step S11, the lifetime value and the resistivity of a second monocrystalline silicon rod that has been pulled may be obtained, and the operation of the monocrystalline silicon rod that is being pulled may be continued.

After the pulling of the second monocrystalline silicon rod is completed, the lifetime value and the resistivity were measured, and the lifetime value and the resistivity are 130 μs and 0.4 Ω·m, respectively.

Repeating step S12, it may be determined whether the lifetime value and the ratio of the lifetime value to the resistivity of the second monocrystalline silicon rod are qualified.

As can be seen from above that the lifetime value 130 μs is greater than the set value 120-125 μs; and the ratio of the lifetime value to the resistivity is 325, which is greater than the set value of 150-250.

Then, it indicates that the lifetime value and the ratio of the lifetime value to the resistivity of the second monocrystal are both qualified, the parameter requirements of the crystal are satisfied, the operation of the monocrystalline silicon rod being pulled is continued, and the re-feeding and pulling procedure is continued.

Repeating step S11 again, the lifetime value and resistivity of a third monocrystalline silicon rod that has been pulled may be obtained, and the operation of the monocrystalline silicon rod 310 that is being pulled may be continued.

After the pulling of the third monocrystalline silicon rod is completed, the lifetime value and the resistivity are measured, and the lifetime value and the resistivity are 120 μs and 0.5 Ω·m, respectively.

Repeating step S12 again, it may be determined whether the lifetime value and the ratio of the lifetime value to the resistivity of the third monocrystalline silicon rod are qualified.

As can be seen from above that the lifetime value 120 μs is equal to the lower limit value 120 μs in the set value 120-125 μs; and the ratio of the lifetime value to the resistivity is 240, which is in the range of the set value 150-250.

Then, it indicates that both the lifetime value and the ratio of the lifetime value to the resistivity of the third monocrystal are not qualified.

If any of the lifetime value and the ratio of the lifetime value to the resistivity is not greater than the set value, it indicates that the quality of the monocrystalline silicon rod is not qualified and does not meet the parameter requirements of the crystal. The operation of the fourth monocrystalline silicon rod 310 in the process of pulling is continued, and then the operation is converted to the "segment-taking and material suction procedure", that is, after the pulling of the fourth monocrystalline silicon rod 310 is completed, the process of segment-taking and material suction is started.

Then, a segment-taking and material suction procedure may be performed.

At step S21, the monocrystalline silicon rod 310 being pulled may be taken out.

After removing the last monocrystalline silicon rod 310 being pulled from the liquid surface of the molten silicon, the crucible position of the quartz crucible 120 is lowered to a height of 280 mm from the quartz crucible zero position.

At the same time, the power of the main heater 130 and the power of the bottom heater 140 are increased so that the power of the main heater 130 is 10-15 kw higher than that of the main heater at the time of seeding, and the power of the bottom heater 140 is 15-20 kw higher than that of the bottom heater at the time of seeding.

When the rotational speed of the quartz crucible 120 is reduced to 1 r/min, a cooling process is automatically performed for the monocrystalline silicon rod 310 being pulled.

When the monocrystalline silicon rod 310 enters the sub-chamber 210, the isolating valve 220 of the sub-chamber is closed, the sub-chamber 210 is controlled to be opened, and the monocrystalline silicon rod 310 is placed in the crystal taking barrel to be cooled.

At step S22, it may be determined whether a weight of remaining material in the quartz crucible 120 is within a safety range.

After taking out the monocrystalline silicon rod 310 being pulled, the weight of the remaining material in the quartz crucible 120 is measured to be 15 kg, which is smaller than the standard 25 kg, and the next material suction process is started.

Next, a material suction process may be performed.

At step S231, the suction tool 320 may be installed and stabilized.

The seed crystal chuck tool mounted on the heavy hammer 330 is manually removed, and the material suction tool 320 is manually mounted.

After the suction tool 320 is installed, the sub-chamber 210 is closed.

It is judged that the suction tool 320 is successfully installed, and the suction tool 320 is automatically raised to a height of 2400 mm from the seed crystal zero position.

After the suction tool is successfully identified, the suction tool 320 is automatically controlled to fall to a height of 1800 mm from the seed crystal zero position.

After the suction tool 320 does not shake, the next step of the sub-chamber purification procedure is performed.

At step S232, the sub-chamber may be purified.

The suction tool 320 is controlled to be raised again to the minimum identification position 2400 mm when the isolating valve 220 of the sub-chamber 210 is still closed.

The height of the position used to fix the suction tool 320 is unchanged, and the sub-chamber 210 is purified and isolated.

After the purification of the sub-chamber 210 is completed, the isolating valve 220 on the sub-chamber 210 is opened, and the suction tool 320 is controlled to enter the main chamber 110.

At step S233, the stepwise preheating of the suction tool 320 may be performed.

The suction tool 320 is first controlled to be lowered to a height of 600 mm from the seed crystal zero position to perform the first preheating for 1 minute.

Then, the suction tool 320 is controlled to continue to descend to a height of 350 mm from the seed crystal zero position to perform the second preheating for 5 minutes.

After the second preheating is completed, the system controls the suction tool 320 to descend until it comes into contact with the liquid surface of the molten silicon.

When the system receives an alarm of the contact voltage of the suction tool 320, the system automatically adjusts the position of the suction tool 320 to lift 5 mm higher than the liquid surface, and performs a third standing and preheating for 5 minutes for the suction tool 320.

After the third preheating is completed, the system again controls the suction tool 320 to fall onto the liquid surface.

When the contact voltage alarm of the suction tool 320 is received, the system automatically adjusts the rotation speed of the quartz crucible 120 to lr/min, and the stepwise preheating of the suction tool 320 is completed.

At step S234, pressurizing process and sucking out of the remaining material at the bottom of the crucible using the preheated suction tool may be performed.

When the contact voltage alarm of the suction tool is received, the suction tool 320 is controlled to descend to a position of 20 mm below the liquid contacting surface.

The system automatically controls the quartz crucible 120 to stop rotating directly from the original 1 r/min and controls the suction tool 320 to remain stationary.

After the suction tool 320 reaches the designated position, the pressurizing and material suction process is started. At this time, the system automatically exits a pressure control procedure, the throttle valve returns to zero, the rotational speed of the crucible returns to zero, the ball valve is closed, the quick-pressurizing valve is opened, and the material suction is performed. When the furnace pressure in the main chamber 110 reaches 200 torr, the quick-pressurizing valve is closed, the ball valve is automatically opened, the opening of the throttle valve is opened to 15%, and the pressure control procedure is automatically activated.

When the gravity sensor monitors that the weight of the suction tool 320 after the material suction is 42 kg, which is larger than the weight of 20 kg before the material suction, and the suction tool 320 is stationary, the material suction is completed.

At step S235, cooling of the suction tool 320 after the material suction is completed may be performed.

The quartz crucible is started and the rotational speed is 1 r/min.

When the suction tool 320 loaded with the remaining material is controlled to rise to a height of 350 mm from the seed crystal zero position, it is allowed to stand and cool for 15 minutes.

The isolating valve 220 of the sub-chamber 210 is opened, the suction tool 320 loaded with the remaining material is raised into the sub-chamber 210 to the position of 2400 mm as the lowest point of the identification position, and then allowed to stand and cool for another 20 minutes.

After the second cooling is completed, the quick-pressurizing valve is automatically closed, and a pressure control procedure is activated to ensure that the pressure in the main chamber 110 is within a proper range.

The sub-chamber 210 is opened, and the cooled suction tool 320 loaded with remaining material is removed.

1. A method for automatically controlling material suction in the process of pulling-up of a monocrystal designed in the present disclosure may accurately determine a material suction condition without intervention by a person, thereby minimizing a human error, improving work efficiency, and shortening an operation time from the existing 3-4 h for two people to 1-2 h for a single people. Moreover, the integrity of the suction material may be ensured, the suction tool may be repeatedly used for many times, and the production progress is improved.
2. According to the material suction method of the present disclosure, automatic control of the whole process may be realized, and each step is automatically judged and controlled by a machine system without intervention by a person, so that it may achieve less manpower and unmanned, personnel cost is saved to the maximum extent, and production efficiency is improved.
3. The automatic positioning of the liquid surface position and the material suction position is realized. The suction starting position was previously uncertain, but now the system automatically provides the contact voltage alarm when the suction nozzle contacts the liquid surface, so as to control the third preheating of the suction tool and the suction tool to drop to 20-45 mm below the contact liquid surface for the material suction.
4. At the same time, it is also possible to automatically adjust the position of the crucible and the throttle valve, so that after the suction tool reaches the specified position, it directly enters the pressurizing and material suction process. At this time, the system automatically closes the pressure control procedure, the throttle valve returns to zero, the rotational speed of the crucible returns to zero, the ball valve is closed, the quick-pressurizing valve is opened, and the material suction is performed. When the furnace pressure in the main chamber reaches 200 torr, the quick-pressurizing valve is closed, the ball valve is automatically opened, the opening of the throttle valve is opened to 15%, and the pressure control module is automatically activated.

It should be noted that the various value ranges and specific values recited in the present disclosure may be changed and adjusted by those skilled in the art according to the specific process conditions and requirements of the process of pulling-up of a monocrystal, so it should not be regarded as a limitation of the inventive concept described in the present disclosure.

The embodiments of the present disclosure have been described in detail above and are merely preferred embodiments of the present disclosure, and are not to be considered as limiting the scope of implementation of the disclosure. All equivalents and modifications made in accordance with the scope of the present disclosure shall remain within the scope of the present disclosure.

What is claimed is:

1. A method for automatically controlling material suction in a process of pulling-up of a monocrystal, comprising:

obtaining a lifetime value and a resistivity of a pulled monocrystalline silicon rod; and in response to determining that the pulled monocrystalline silicon rod is unqualified based on the lifetime value and a ratio of the lifetime value to the resistivity, performing a segment-taking and material suction procedure;

wherein performing the segment-taking and material suction procedure comprises:

in response to determining that a weight of remaining material in a crucible is less than or equal to a predetermined weight value, performing a material suction process using a suction tool, wherein performing the material suction process comprises performing a stepwise preheating of the suction tool, and performing the stepwise preheating of the suction tool comprises:

standing and preheating the suction tool at least twice as the suction tool descends;

upon completing the standing and preheating at least twice, controlling the suction tool to descend towards a liquid surface of the remaining material in the crucible and determining whether the suction tool is in contact with the liquid surface of the remaining material in the crucible;

in response to determining that the suction tool is in contact with the liquid surface and a contact voltage alarm occurs, adjusting the suction tool to be lifted up to a predetermined position, and standing and preheating the suction tool again for a predetermined time;

controlling the suction tool to descend towards the liquid surface again and determining whether the suction tool is in contact with the liquid surface again; and in response to determining that the suction tool is in contact with the liquid surface and the contact voltage alarm occurs again, adjusting a rotational speed of the crucible to a predetermined value.

2. The method according to claim 1, wherein the determining of that the pulled monocrystalline silicon rod is unqualified comprises:

in response to determining that the lifetime value is less than or equal to a preset lifetime value and/or the ratio of the lifetime value to the resistivity is less than or equal to a preset ratio value, determining that the pulled monocrystalline silicon rod is unqualified.

3. The method according to claim 2, further comprising:

in response to determining that the lifetime value is greater than the preset lifetime value and the ratio of the lifetime value to the resistivity is greater than the preset ratio value, determining that the pulled monocrystalline silicon rod is qualified, and continuing a re-feeding and pulling procedure.

4. The method according to claim 1, wherein performing the segment-taking and material suction procedure further comprises:

in response to determining that the weight of the remaining material in the crucible is greater than the predetermined weight value, continuing pulling of a monocrystalline silicon rod being pulled; and taking out the monocrystalline silicon rod being pulled.

5. The method according to claim 1, wherein performing the material suction process using the suction tool further comprises:

installing and stabilizing the suction tool, and purifying a sub-chamber, before performing the stepwise preheating of the suction tool; and sucking out the remaining material in the crucible using the preheated suction tool after performing the stepwise preheating of the suction tool.

6. The method according to claim 5, wherein the sucking out of the remaining material in the crucible using the preheated suction tool comprises:

in response to determining that the suction tool is in contact with the liquid surface of the remaining material in the crucible and the contact voltage alarm occurs, controlling the suction tool to descend to a predetermined depth below the liquid surface;

stopping the crucible from rotating and allowing the suction tool to stand;

pressurizing the sub-chamber to a standard material suction pressure value to begin sucking the remaining material in the crucible using the preheated suction tool; and in response to determining that a weight of the suction tool after sucking the remaining material is greater than a weight of the suction tool before sucking the remaining material and remains constant, finishing the sucking out of the remaining material in the crucible using the preheated suction tool.

7. The method according to claim 1, wherein a re-feeding process is performed after the segment-taking and material suction procedure is finished.

8. A method for automatically controlling material suction in a process of pulling-up of a monocrystal, comprising:

obtaining a lifetime value and a resistivity of a pulled monocrystalline silicon rod, and continuing to operate a monocrystalline silicon rod being pulled; and in response to determining that the lifetime value is less than or equal to the preset lifetime value or/and the ratio of the lifetime value to the resistivity is less than or equal to the preset ratio value, performing a segment-taking and material suction procedure;

wherein performing the segment-taking and material suction procedure comprises:

in response to determining that remaining material in a quartz crucible is not within a safety range, stopping pulling of the monocrystalline silicon rod being pulled, and starting to perform a material suction process using a suction tool, wherein performing the material suction process comprises performing a stepwise preheating of the suction tool, and performing the stepwise preheating of the suction tool comprises:

standing and preheating the suction tool at least twice, wherein, as the suction tool descends, the standing and preheating of the suction tool every time is prolonged by 4-10 min than that of a previous time;

controlling the suction tool to descend towards a liquid surface of molten silicon and determining whether the suction tool is in contact with the liquid surface of molten silicon;

upon receiving a contact voltage alarm from the suction tool, adjusting the suction tool to be lifted up by 1-5 mm, and standing and preheating the suction tool again for a predetermined time;

controlling the suction tool to descend towards the liquid surface of molten silicon again and determining whether the suction tool is in contact with the liquid surface of molten silicon again; and upon receiving the contact voltage alarm from the suction tool again, adjusting a rotational speed of the quartz crucible to 1 r/min, and finishing the stepwise preheating of the suction tool.

9. The method according to claim 8, wherein the lifetime value and the resistivity are both obtained by testing at a same position on a head of the pulled monocrystalline silicon rod.

10. The method according to claim 8, wherein the preset lifetime value ranges from 120 μs to 125 μs, and the preset ratio value ranges from 150 to 250.

11. The method according to claim 8, wherein performing the segment-taking and material suction procedure further comprises:

in response to determining that the remaining material in the quartz crucible is within the safety range, continuing to perform the pulling of the monocrystalline silicon rod being pulled until a weight of the remaining material in the quartz crucible is not greater than 25 kg.

12. The method according to claim 11, wherein, before performing the material suction process using the suction tool, operations as follows are performed:

bringing a last monocrystalline silicon rod being pulled off the liquid surface of molten silicon;

in response to determining that the rotational speed of the quartz crucible is reduced to 1-2 r/min, automatically performing a cooling process on the last monocrystalline silicon rod being pulled;

controlling a position of the quartz crucible down to a preset suction position;

taking out the last monocrystalline silicon rod being pulled; and increasing a power of a main heater and a power of a bottom heater.

13. The method according to claim 12, wherein the increasing of the power of the main heater and the power of the bottom heater comprises:

increasing the power of the main heater to be 10-15 kw higher than a power of the main heater at a time of seeding; and increasing the power of the bottom heater to be 15-20 kw higher than a power of the bottom heater at the time of seeding, wherein the power of the main heater and the power of the bottom heater remain constant during the material suction process until end of the material suction process.

14. The method according to claim 12, wherein performing the material suction process using the suction tool further comprises:

purifying a sub-chamber, before performing the stepwise preheating of the suction tool; and sucking out the remaining material at a bottom of the quartz crucible using the preheated suction tool after performing the stepwise preheating of the suction tool.

15. The method according to claim 14, wherein performing the material suction process using the suction tool further comprises:

before the purifying of the sub-chamber, and in response to determining that the suction tool is installed and the suction tool is shaking, making an alarm and prompting to convert to manual stability control.

16. The method according to claim 14, wherein the purifying of the sub-chamber comprises:

controlling the suction tool to be lifted to a minimum identification position;

purifying and isolating the sub-chamber; and opening an isolating valve on the sub-chamber to control the suction tool to enter a main chamber.

17. The method according to claim 14, wherein the sucking out of the remaining material at the bottom of the quartz crucible using the preheated suction tool comprises:

upon receiving the contact voltage alarm from the suction tool, controlling the suction tool to descend to 20-45 mm below the liquid surface of molten silicon;

stopping the quartz crucible from rotating, and standing the suction tool;

rapidly pressurizing the sub-chamber to a standard material suction pressure value to begin sucking the remaining material at the bottom of the quartz crucible using the preheated suction tool; and in response to determining that a weight of the suction tool after sucking the remaining material is greater than a weight of the suction tool before sucking the remaining material and remains constant, finishing the sucking out of the remaining material at the bottom of the quartz crucible using the suction tool.

18. The method according to claim 17, wherein performing the material suction process using the preheated suction tool further comprises:

after finishing the sucking out of the remaining material at the bottom of the quartz crucible using the suction tool, starting the quartz crucible to rotate at the rotational speed of the quartz crucible lower than a preset speed;

in response to determining that the suction tool loaded with the remaining material is lifted up into a water cooling jacket, standing and cooling the suction tool for a first period of time;

lifting the suction tool loaded with the remaining material up to a lowest point of an identification position within the sub-chamber, and standing and cooling the suction tool for a second period of time that is longer than the first period of time;

initiating a pressure control procedure; and opening the sub-chamber and taking out the cooled suction tool.

* * * * *